United States Patent [19]

Berbeco

[11] Patent Number: 4,662,514

[45] Date of Patent: * May 5, 1987

[54] ELECTRICALLY CONDUCTIVE POLYMERIC TUBES FOR STATIC SENSITIVE ELECTRONIC DEVICES

[75] Inventor: George R. Berbeco, W. Newton, Mass.

[73] Assignee: Charleswater Products, Inc., West Newton, Mass.

[*] Notice: The portion of the term of this patent subsequent to Jun. 24, 2003 has been disclaimed.

[21] Appl. No.: 724,279

[22] Filed: Apr. 17, 1985

Related U.S. Application Data

[63] Continuation-in-part of Ser. No. 547,436, Nov. 1, 1983, Pat. No. 4,596,668.

[51] Int. Cl.$^4$ .................. B65D 73/02; H01B 1/00
[52] U.S. Cl. .................... 206/328; 428/922; 252/500
[58] Field of Search ............. 206/328; 428/922, 924; 361/220, 212; 252/500, 501; 524/911, 912, 913, 914

[56] References Cited

U.S. PATENT DOCUMENTS

| | | | |
|---|---|---|---|
| 3,929,743 | 12/1975 | Sramek | 524/914 |
| 3,933,779 | 1/1976 | Baron et al. | 524/913 |
| 4,004,054 | 1/1977 | Audykowski et al. | 524/912 |
| 4,011,176 | 3/1977 | Saunders et al. | 252/500 |
| 4,025,704 | 5/1977 | Trevoy | 252/501 |
| 4,084,034 | 4/1978 | Jansma et al. | 252/500 |
| 4,313,978 | 2/1982 | Stevens et al. | 524/913 |
| 4,382,990 | 5/1983 | Coates | 524/912 |

*Primary Examiner*—Joseph Man-Fu Moy
*Attorney, Agent, or Firm*—Richard P. Crowley

[57] ABSTRACT

A transparent polymeric container, such as a dual in line or slide tube, for the storage, transportation or handling of static sensitive semi-conductive microchips or electronic devices, which tube comprises: a dual in line polymeric transparent tube for the storage or transportation of static sensitive microchips or integrated circuits, which tube has been treated with an electrically conductive surface coating composition composed of a film-forming polymer and a quaternary ammonium compound as an antistatic agent to provide a surface electrical resistance of the treated tube of about $10^8$ ohm/sq. inch or less.

17 Claims, 1 Drawing Figure

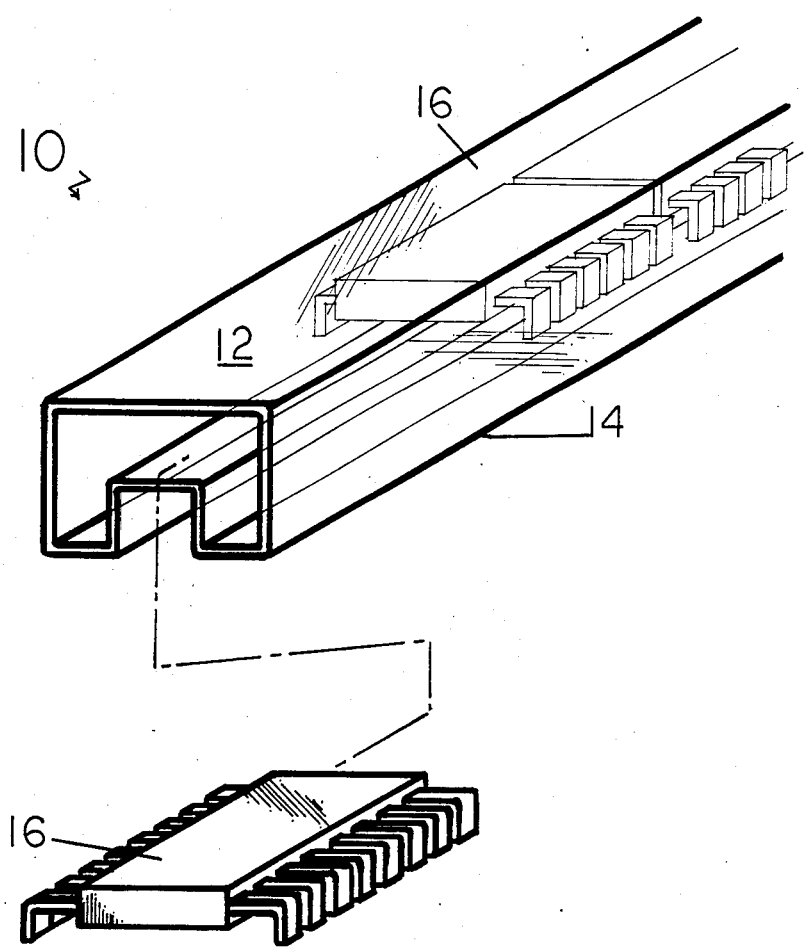

ELECTRICALLY CONDUCTIVE POLYMERIC TUBES FOR STATIC SENSITIVE ELECTRONIC DEVICES

REFERENCE TO PRIOR APPLICATIONS

This application is a continuation-in-part of U.S. patent application Ser. No. 547,436, filed Nov. 1, 1983, now U.S. Pat. No. 4,596,668, which application is hereby incorporated by reference in its entirety.

The parent application is directed to electrically conductive water-soluble, colloidal surface-coating compositions for use particularly as hard, durable floor surface coatings and to provide electrostatic discharge protection to a treated surface. The surface coated compositions of the parent application comprises a colloidal-type emulsion of a film-forming water-soluble low-molecular-weight polyampholyte polymer which contains free carboxylic groups and carboxylic amino ester groups in combination, together with an effective amount of an antistatic agent, such as a quaternary ammonium compound to provide a surface coating which has a surface resistance of about $10^9$ or $10^{10}$ ohm/sq. inch or less and a discharge to zero in less than 0.1 seconds.

The aqueous emulsion composition of the parent application comprises an acrylic polyampholyte copolymer containing amino ester groups and carboxylic acid-base neutralizing groups, generally in an amount of from 5 to 30 percent by weight of the copolymer and a quaternary ammonium compound. The polyampholyte copolymer employed generally comprises a copolymer of a monomeric acrylic acid, like methacrylic acid, and one or more hard, soft or hydrophilic acrylic monomers, like an alkyl acrylate such as butyl acrylate, an alkyl methacrylate such as methyl methacrylate or a hydroxy alkyl acrylate. The carboxylic acid groups are reacted with ethylene imine in an amount of from 25 to 70 percent, and the remaining free carboxylic acid groups of the copolymer are neutralized with a base, like ammonium hydroxide. The copolymer thus comprises a methyl methacrylic acid reacted with a soft monomer, a hard monomer, and a hydrophilic monomer, such as for example the combination of an alkyl methacrylate, an alkyl acrylate and a methylacrylic acid, and often includes a cross-linking amount of an agent like a polyvalent metal ion, typically zinc. The quaternary ammonium compounds employed as antistatic agents include the n-alkyl dimethyl benzyl quaternary ammonium salts as well as the n-alkyl fatty quaternary ammonium halides and other quaternary ammonium salts, such as cetylpyridinium halides such as cetylpyridinium bromide or chloride, which also acts as antibacterial agents.

BACKGROUND OF THE INVENTION

Clear plastic tubes having various profiles and sizes, such as dual in line (DIP) tubes, are commonly employed in the electronic industry for the storage, transportation or handling of semi-conductive microchips and integrated circuits. Generally the DIP tubes are formed of a polymeric material which is transparent or at least highly translucent, for example of a vinyl chloride resin, acrylic resin or similar transparent polymer material, and designed to hold a plurality of microprocessor chips of the MOS type employed in semi-conductive devices. The microprocessor chips are stored, transported and handled in such tubes, and the tubes are made transparent so as to provide for visual observation of the microprocessor chips stored therein.

Thus, semi-conductive devices are stored and transported in such tubes from the manufacturer to the distributor and then the ultimate user, wherein the microprocessor chips so stored and transported are employed in semi-conductive devices by opening the tube and pouring or sliding out the microprocessor chips for delivering the microprocessor chips into the desired electronic device for insertion into a circuit board. The movement of the stored integrated circuits in the tube may give rise to undesired static charges. Since microprocessor chips are subject to damage by static electricity generated during the storage, transporation or handling of the chips, it is desirable to provide a transparent plastic container, such as dual in line DIP tubes, to reduce or prevent damage by static charges to the static sensitive microprocessor chips or other electronic devices in nonconductive polymeric containers or packages.

Early control techniques for the control of static charges were developed for relatively less sensitive electronic devices and are not satisfactory for present day highly static sensitive devices. Such early techniques blended or incorporated an antistatic agent within a plastic to obtain an antistatic plastic which was not wholly effective, so that typically only electrically conductive plastics were used with such static sensitive earlier devices. Present day electronic devices are more static sensitive so that often new circuits are sensitive to even as low as about 50 volts of static charge. Thus, a simple but effective technique and method to provide highly transparent tubes with a low or zero static charge generation and with static dissipating properties is most desirable.

SUMMARY OF THE INVENTION

The invention relates to an electrically conductive plastic container for static sensitive electronic devices and to electrically conductive surface compositions for use in treating such plastic containers to provide surface electrical conductivity and static discharge protection and to the method of treating such plastic containers.

In particular, the invention concerns a plastic transparent tube, such as a dual in line (DIP) tube or plastic slide for integrated circuits, which transparent tube surface has been coated or treated with an electrically conductive surface coating composition to provide for a hard coating secured thereon, and to provide a surface electrical resistance of about $10^8$ ohms/sq. or less.

The invention concerns improved containers, typically a transparent plastic container such as a dual in line DIP tube for the storage, transporation or handling of static sensitive microprocessor chips, integrated circuits and electronic devices and to an electrically conductive surface coating composition for use in the treating, particularly the surface coating, of the containers to provide electrodischarge protection for such microprocessor chips and electronic devices by providing a surface electrical resistance through the containers of about $10^8$ ohm/sq. or less and to prevent buildup of static charges. The surface coating composition provides electrostatic discharge protection, and comprises a hard, adhesive, typically clear, film-forming polymer and an effective amount of an antistatic agent such as a quaternary ammonium compound.

The treated tubes of the invention provide for a clear coating so that the crysftal clear transparency of the tubes essential for the use of the tubes in the dispensing of the protected devices is not compromised. The treated tubes also meet the requirements of the Electronic Industries Association IS5 standard for class I, II, III and IV devices, MIL-B-81705, and may have surface resistivity of $10^7$ ohm/sq. or less.

The quaternary ammonium antistatic agent is employed in an amount sufficient to provide for electroconductivity or a surface electrical resistance of about $10^8$ ohm/sq. inch or less, for example $10^7$ or less, and an electrostatic discharge to zero in less than 0.1 seconds of the treated container. The film-forming composition of the invention is prepared by adding antistatic agents, such as an effective amount of the quaternary ammonium salt, alone or in combination with other antistatic agents, and optionally other additives, to an aqueous colloidal-type emulsion of a film-forming polymer composition. The treating composition of the invention comprises an aqueous emulsion of a film-forming polymer and an effective amount of an antistatic agent, typically ranging from about 0.5 to 25 percent by weight of the composition, and more typically ranging from about 1 to 15 and preferably from about 4 to 12 percent by weight of a quaternary ammonium salt which is water soluble or water dispersable in the aqueous polymer emulsion. Optionally the treating composition may contain a small amount of a salt, such as an alkali metal halide such as ammonium, sodium, magnesium or potassium chloride, to provide for stabilization or enhanced electrical conductivity of the emulsion and a water-soluble base, such as an alkali metal or ammonium hydroxide, such as ammonium hydroxide, for the adjustment of the pH to place the treating solution on the alkaline side, for example to a pH of about 8.0 to 10.5, and optionally a cross-linking agents for the polymer in an amount generally up to about 0.05 to 2 weight percent and more typically 0.1 to 1 percent by weight of the composition.

The remaining part of the treated composition may include water-soluble or water-dispersible additives, such as optionally small amounts of dispersing agents and surface active agents and surfactants, typically a nonionic surfactant in an amount ranging from 0.05 to 1.0, e.g. 0.1 to 0.5, percent by weight and stabilizers such as polyalkalene glycol which also may function as antistatic agents, such as polyethylene glycol and polypropylene glycol, as well as buffering agents, antibacterial agents, plasticizers, stabilizers, and pigments, fillers, dyes, metal oxides, and carbon particles where clarity of the film is not desired or of importance. In addition or optionally, the treating composition may contain small amounts, typically less than 20 percent by weight and more typically less than 10 percent, for example 0.1 to 8 percent by weight, of water-miscible diluents in order to promote the solubility of the treating composition ingredients or to provide antifreeze protection to the emulsion treating composition. Typical water-miscible or water-soluble organic solvents and diluents would include, but not be limited to: alcohols, such as aliphatic alcohols like methanol, ethyl alcohol and isopropyl alcohol; ketones, such as acetone, methyl ethyl ketone; ethers, such as mono and dialkyl ethers of diethylene glycol, such as diethylene glycol monobutyl ether; and glycols, such as ethylene glycol and propylene glycol and combinations thereof. If desired, non-water-soluble diluents, such as volatile hydrocarbons, like toluenes or aliphatics hydrocarbons, which are made miscible in combination of other liquids may be used.

The treating compositions of the invention should be formulated so as to provide a hard, generally transparent, adhesive, chip resistant antistatic surface coating on the plastic container, such as the slide tubes, and which surface coating is compatible with and adheres securely to the polymeric surface of the DIP or slide tube. Treating compositions which form cloudy films and which do not adequately adhere to the surface of the polymeric tube or which form greasy or opaque-type film generally are not desirable. The thin coating, e.g. 0.1 to 20 mils, on the surface of the polymeric DIP tubes should adhere to the tube surface so as to provide for general handling of the tube with the static-sensitive microprocessor chips therein without damage to the coating and yet provide sufficient clarity so that the nature and type and amount of the microprocessor chips or circuits within the tubes is not obscured and yet provide effective antistatic protection to the chips or circuits therein.

The treating emulsion composition has a composition as follows:

(1) water-soluble or water-dispersible film-forming polymer, such as a polyacrylate or polyvinyl acetate polymer to 70 percent by weight (e.g. 5 to 50 percent by weight);

(2) quaternary ammonium compound to 30 percent by weight (e.g. 1 to 20 percent by weight);

(3) water-soluble salt (optional) to 15 percent by weight;

(4) base such as ammonium hydroxide to addjust pH to 8 to 10;

(5) cross-linking agent (optional) such as multifunctional aziridine or multivalent metal ion;

(6) other additives (optional) like glycols, pigments, powders to 10 percent by weight;

(7) surfactant, such as a nonionic surfactant like an ethoxylated nonylphenols or an anionic surfactant like organic phosphate esters; and (8) water to 100 percent by weight.

The polymer comprises a film-forming polymer which is water-soluble or water-dispersible to form a colloidal emulsion composition and may comprise, but is not limited to: vinyl polymers like vinyl esters such as polyvinyl short chain acid polymers like ethylene vinyl acetate and polyvinyl acetate; vinyl pyrrolidones like polyvinylpyrrolidone; urethane polymers; and polyacrylate polymers, which polyacrylate polymers may be polyampholyte polymers with acid-neutralized and amino groups or acrylic polymers or copolymers of acrylic monomer, all of which polymers form a clear chip-resistant adhering film on drying. Typical acrylic monomers include: alkyl acrylic, alkyl methacrylic, such as acrylic acid, butyl acrylate, ethyl acrylate 2-ethylhexyl acrylate, methyl acrylate, isobutyl acrylate and hydrophilic acrylic monomer, such as hydroxy alkyl or amino alkyl acrylates and methacrylates like 2-hydroxyethyl acrylate or methacrylate. A monomer to impart increased water solubility or water miscibility may be incorporated in the polyacrylate polymers.

The quaternary ammonium compounds for use in the composition includes these water-soluble or water-dispersible compounds compatible with the film-forming polymers and which provide the desired electroconductive properties to the coating on the plastic substrate. The compounds are typically salts and the anionic group of the compound may vary, such as a halide, like chloride or bromide, an acid, like acetate or sulphate, or a hydroy group. The quaternary ammonium compounds may have one or more hydrocarbon groups on the nitrogen atom, such as alkyl, alkylene, and benzly groups. One class of quaternary compounds includes: mono, di, and tri fatty $C_{12}$–$C_{20}$-alkyl quaternary ammonium compounds with the fatty group being saturated or unsaturated, such as $C_{12}$–$C_{18}$-methyl quaternary ammonium salts. Another class of quaternary ammonium compounds includes; alkyl-benzyl compounds, such as $C_1$–$C_4$ alkyl benzyl compounds, like alkyl dimethyl benzyl, dialkyl methyl benzyl, and alkyl-methyl compounds such as trimethyl alkyl, and dimethyl dialkyl quaternary ammonium compounds. Another class of compounds includes the pyridinium compounds such as $C_{12}$–$C_{20}$ fatty compounds, like cetyl pyridinium halides such as chloride and bromide. These compounds are also useful in providing anti-bacterial action as well as anti-static properties. A further class of compounds is the ethoxylated quaternary ammonium compounds such as the alkyl-$C_8$–$C_{10}$ ethoxylated compounds. Also, suitable are alkyl-unsaturated quaternary ammonium compounds, such as the methyl-allyl quaternary ammonium salts like, but not limited to: dimethyl diallyl quaternary ammonium chloride. Specific compounds comprise n-alkyl dimethyl benzyl ammonium chloride, while particularly preferred are cetyltrimethyl, ammonium bromide, cetyl pyridinium chloride, and aliphatic quaternary compound such without benzyl groups, such as the methyl-alkyl and alkyl-fatty quaternary compounds. The quaternary compound may be used alone or in combination or with other anti-static agents, such as polyalkylene glycols like polyethylene glycol and polypropylene glycol.

Often the composition includes a small dispersing amount of a surface active agent or surfactant, such as a nonionic or anionic surfactant to provide a stable colloidal emulsion composition. Where clarity of the coated or treated tube is not of importance, the composition may include compounds which would reduce the clarity of the resulting film coating, such as pigments or dyes or metal powder, like nickel, or carbon black to enhance the anti-static properties of the coating. Optionally but preferably, the composition will include: water-soluble volatile organic compounds to promote more rapid air or oven drying and to aid in maintaining or controlling the solubility of the polymer or other components of the composition. Usually, such solvents or diluents are oxygen-containing organic compounds, such as isopropanol or volatile ketones like acetone and methylethyl butane.

The plastic containers to be treated may vary in size and profile and include, but are not limited to the plastic slide or storage tubes for integrated circuits and microchips. Such containers are formed of hard, clear, plastic, such as acrylic or vinyl resins, such as polyacrylate or vinyl chloride resins, such as a plasticized polyvinyl chloride which is extruded or molded into a clear tube or other form.

The containers are treated by coating the surface of the container with the composition and drying, either by air or oven drying, the container to form a hard, adhering polymer film coating containing the quaternary ammonium compounds. The composition may be coated by dipping the tube into the solution and then air drying the dipped tube at ambient temperature or by oven drying or by having the surface sprayed or otherwise coated with the composition. The entire surface of the tube should be coated to provide proper protection so that dip coating is the preferred technique.

The invention will be described for the purposes of illustration only by certain embodiments; however, it is recognized that various changes, additions, and improvements to the illustrated embodiments may be made by those persons skilled in the art, all falling within the spirit and scope of the invention.

BRIEF DESCRIPTION OF THE DRAWING

The drawing is a perspective view of a treated slide tube of the invention.

DESCRIPTION OF THE EMBODIMENTS

The drawing shows a clear polyvinyl chloride dual in line (DIP) or slide tube 10 which comprises a clear tube 12 with a thin adherent polymer film surface coating 14 containing a quaternary ammonium compound, which tube 12 has been dip coated in a treating composition of the invention. The tube contains therein a plurality of stored integrated circuits 16 with one integrated circuit shown outside the tube and ready for insertion. The integrated circuits 16 contain microchips which are static sensitive. The coating 14 provides a surface electrical conductivity of about $10^8$ to $10^7$ ohm/sq. and a static discharge to zero in less than 0.1 seconds.

EXAMPLE 1

A clear plastic container, such as a tube of the drawing, is treated with an electrically conductive polyampholyte colloidal emulsion composition by dip coating and then air drying the tipped tube. The composition has the formulation:

| Ingredients | | Parts by Weight |
|---|---|---|
| 1. Polyampholyte polymer (copolymer of methacrylic acid, butyl acrylate, and methyl methacrylate in a ratio of 20/40/40 and 25–70% of the carboxylic acid groups reacted with ethylene imine) | | 14.0 |
| 2. Surfactant - Triton X100 (a trademark of Rohm & Haas Co. for a non-ionic surfactant) | | 0.5 |
| 3. Carbitol (a trademark of Union Carbide Corporation) | | 2.5 |
| 4. Cross-linking agent (optional), e.g. Zinc (Zinc acetate variable as to number of free carboxylic groups) | | 0.4 |
| 5. Ammonium hydroxide | to pH | 9.0 |
| 6. n-alkyl dimethyl benzyl quaternary ammonium chloride | | 1.0 |
| 7. Water | Balance | |
| (total nonvolatile content about 16.0 wt. %) | | |

A tube so treated has a surface resistivity of $10^9$ ohm/sq. or less.

EXAMPLE 2

A number of emulsion compositions were prepared and a clear PVC DIP or slide tube dipped into the compositions and air dried at 70°–80° F. for 2 to 4 hours. The dip coated tubes were then tested for surface electrical resistivity with a Genrad 1846 megohmmeter at 100 volts input voltage. All dipped tubes treated gave surface resistivity of $10^9$ to $10^8$ ohm/sq. Dipped tubes were also tested to determine the ability of the treated tube to generate a static charge. The outer surface of the treated tube was rubbed vigorously with a wool cloth five times and the charge generation measured with an electrostatic volt meter. The untreated PVC DIP tubes had a charge generation of about 2000 volts, while treated DIP tubes showed little or no static charge when so rubbed. The compositions tested are shown in the following table:

| Ingredients | FORMULATIONS | | | |
|---|---|---|---|---|
| | 1 | 2 | 3 | 4 |
| 1. Polymer | | | | |
| (a) Polyvinyl Acetate co-polymer emulsion 42% solids (Davis Industries, Kansas City, MO) | 80 | 90 | | |
| (b) NeoCryl (Polyvinyl Chemicals Co., Wilmington, MA) a water based acrylic polymer emulsion | | | 85 | 55 |
| (c) Thermosetting urethane emulsion (Pervel Co., CT) | | | | 30 |
| 2. Quaternary Ammonium Compound | | | | |
| (a) Crystat 609 (American Cyanamide Co.) | 20 | | | |
| (b) Agefloc M-7Q (CPS Chemicals Co., Goldbridge NJ) | | 10 | | |
| (c) Avitex (Du Pont de Nemours, E.I. & Co.) | | | 15 | 15 |
| 3. Surfactant | | | | |
| (a) Gafac - phosphate ester (GAF Corp.) | | | 0.05 | |
| (b) Electrical Resistivity | $5 \times 10^8$ | $3 \times 10^7$ | $1 \times 10^8$ | $4 \times 10^7$ |

EXAMPLE 3

A DIP tube was dip coated with an emulsion composition as follows:

| Ingredients | Percent by Weight |
|---|---|
| 1. polyacrylate polymer emulsion pH 8, viscosity 100 cps, 85% weight of polymer | 70 |
| 2. n-alkyl-methyl quaternary ammonium sulfate | 15 |
| 3. potassium chloride | 1–4 |
| 4. Ammonium hydroxide to adjust pH to 9.5–10 | |
| 5. Aziridine cross-linking agent | 0.1–2 |
| 6. water | 10 |

A DIP tube coated with the above forumulation provides a surface reistivity of $10^9$ or less.

EXAMPLE 4

The Examples 2 and 3 are repeated employing as the quaternary ammonium compound cetyl pyridinium chloride to provide both an antibacterial and antistatic protective film on the tube.

What is claimed is:

1. A polymeric container for static sensitive electronic devices, which container comprises: a transparent nonconductive polymeric container having a thin, dry surface coating thereon of a film-forming polymer; and a quaternary ammonium compound in an amount to provide a surface resistivity of about $10^9$ ohm/sq. or less and a sftatic charge generation to zero in less than about 0.1 seconds.

2. The container of claim 1 which comprises a tube for the handling, storage or transportation of integrated circuits or microchips.

3. The container of claim 1 which comprises a tube composed of clear acrylic resin or a vinyl halide resin.

4. The container of claim 1 which comprises an elongated inverted U-shaped tube adapted to contain integrated circuits therein.

5. The container of claim 1 wherein the film-forming polymer is selected from the group consisting of water-soluble or water-dispersible acrylate polymers, urethane polymers, and polyvinyl acetate polymers.

6. The container of claim 1 wherein the quaternary ammonium compound is an alkyl-fatty quaternary ammonium salt.

7. The container of claim 1 wherein the quaternary ammonium compound is present in an amount of from about 1 to 30 percent of the coating composition.

8. The container of claim 1 wherein the quaternary ammonium compound comprises a methyl-alkyl quaternary ammonium compound.

9. The container of claim 1 wherein the quaternary ammonium compound is a fatty pyridinium halide.

10. The container of claim 1 which comprises a clear elongated tube to contain integrated circuits, and where the surface electrical resistivity is about $10^8$ or less.

11. The container of claim 1 which has been dip coated in a film-forming aqueous emulsion composition to form the thin coating, which composition comprises: up to 70 percent by weight of a film-forming polymer; from about 1 to 20 percent by weight of a quaternary ammonium compound; and up to 2 weight percent of a surfactant.

12. The container of claim 11 wherein the film-forming polymer comprises a polyacrylate polyampholyte polymer containing base neutralized carboxylic acid groups and amino groups.

13. The container of claim 1 which has been dip coated in a film-forming emulsion composition to form the thin coating, which composition comprises: a water-dispersible polyacrylate composed of an alkylacrylate and methacrylic acid; and a base to provide a water-soluble film-forming polymer, and which composition contains from about 1 to 20 percent by weight of an alkyl-fatty or alkyl-methyl quaternary ammonium salt.

14. The container of claim 13 wherein the composition contains up to about 10 percent by weight of an alkali metal halide.

15. The container of claim 13 wherein the quaternary ammonium salt is a alkyl quaternary ammonium sulfate.

16. An in line clear plastic tube for integrated circuits or microchips, which tube comprises an acrylic resin or vinyl halide resin tube which has been dip coated in a composition to form a thin, dry surface coating thereon, the composition comprises a film-forming polymer and from 1 to 20 percent by weight of a quaternary ammonium compound to provide a surface electrical resistivity of about $10^8$ or less and a zero static charge generation.

17. A method of preparing a plastic container to contain static sensitive electronic devices, which method comprises: coating the entire surface of a clear polymer nonconductive container with an emulsion composition comprising a film-forming polymer and an antistatic amount of a quaternary ammonium compound to form a thin, dry, transparent coating on the surface and to provide a surface electrical resistivity of about $10^9$ ohm/sq. or less and a zero static charge generation.

* * * * *